United States Patent

Deeter et al.

Patent Number: 5,483,161
Date of Patent: Jan. 9, 1996

[54] FARADAY EFFECT CONTINUOUS CIRCUIT FLUX CONCENTRATING MAGNETIC FIELD SENSOR

[75] Inventors: Merritt N. Deeter; Gordon W. Day, both of Boulder, Colo.; Marc A. Manheimer, Greenbelt; Thomas J. Beahn, Derwood, both of Md.

[73] Assignee: The United States of America as represented by the Secretary of Commerce, Washington, D.C.

[21] Appl. No.: 989,990

[22] Filed: Dec. 11, 1992

[51] Int. Cl.$^6$ ............. G01R 33/032; G01R 33/02
[52] U.S. Cl. ............. 324/244.1; 324/96; 359/280; 250/225
[58] Field of Search ............ 324/96, 244, 244.1, 324/117 R, 117 H, 260–262, 251–253; 359/280, 281, 282, 283; 250/225; 385/6, 12, 14; 356/364, 368

[56] References Cited

U.S. PATENT DOCUMENTS

| | | | |
|---|---|---|---|
| 3,324,393 | 6/1967 | Casey et al. | 324/96 |
| 3,590,374 | 6/1971 | Evans et al. | 324/96 |
| 3,902,252 | 9/1975 | Farber | 33/361 |
| 3,980,949 | 9/1976 | Feldtkeller | 324/96 |
| 4,185,265 | 1/1980 | Griffin et al. | 324/251 X |
| 4,482,255 | 11/1984 | Gygax et al. | 368/10 |
| 4,560,932 | 12/1985 | Mitsui et al. | 324/244 |
| 4,581,579 | 4/1986 | Nagatsuma et al. | 324/244 |
| 4,604,577 | 8/1986 | Matsumura et al. | 324/244 |
| 4,631,402 | 12/1986 | Nagatsuma et al. | 324/96 |
| 4,692,703 | 9/1987 | Extance et al. | 324/251 |
| 4,728,178 | 3/1988 | Gualtieri et al. | 350/377 |
| 4,745,357 | 5/1988 | Miller | 324/96 |
| 4,755,665 | 7/1988 | Ulmer, Jr. | 324/96 |
| 4,770,504 | 9/1988 | Hansen et al. | 350/377 |
| 4,791,361 | 12/1988 | Beihoff et al. | 324/126 |
| 4,947,035 | 8/1990 | Zook et al. | 324/96 |
| 4,947,107 | 8/1990 | Doerfler et al. | 324/244 |
| 4,973,899 | 11/1990 | Jones et al. | 324/244 |
| 5,008,611 | 4/1991 | Ulmer, Jr. | 324/96 |
| 5,041,761 | 8/1991 | Wright et al. | 315/129 |
| 5,041,780 | 8/1991 | Rippel | 324/251 X |
| 5,075,546 | 12/1991 | Kamada et al. | 250/225 |
| 5,119,025 | 6/1992 | Smith et al. | 324/260 X |
| 5,149,962 | 9/1992 | Maurice | 324/96 |

FOREIGN PATENT DOCUMENTS

| | | | |
|---|---|---|---|
| 087086 | 3/1990 | Japan | 324/251 |
| 2052053 | 5/1979 | United Kingdom | 324/244.1 |

OTHER PUBLICATIONS

M. Deeter et al, "Fast, Sensitive Magnetic–Field Sensors Based on the Faraday Effect in Yig" Dec. 1990.
M. Deeter et al, "Faraday–Effect Magnetic Field Sensors Based on Substituted Iron Garnets" 1990.
M. Deeter et al, "Sensitivity Limits to Ferrimagnetic Faraday Effect Magnetic Field Sensors" Nov. 1991.

Primary Examiner—Sandra L. O'Shea
Assistant Examiner—Jay M. Patidar
Attorney, Agent, or Firm—Rick Martin

[57] ABSTRACT

A general-purpose magnetic field sensor capable of sensitively measuring uniform magnetic fields includes a magneto-optic (Faraday-effect) sensor and a flux concentrator. Both the magneto-optic sensor and the flux concentrator have high magnetic permeability. The magneto-optic sensor is positioned in close proximity to the flux concentrator. The combination of the high-permeability magneto-optic material and the flux concentrator creates a magnetic circuit which efficiently concentrates the magnetic field into the magneto-optic sensor, and greatly enhances the measurement sensitivity. The preferred embodiment uses a pair of cylindrical flux concentrators in axial alignment. A sensing beam passes through a central axis hole in the cylindrical flux concentrators. The Faraday effect sensor is co-axially aligned with the holes in the cylindrical flux concentrators. The concentrators and Faraday effect sensor create a continuous flux concentrating magnetic circuit.

8 Claims, 6 Drawing Sheets

Comparison of Faraday Effect Sensors With Standard Magnetometers

| | Hall Probe | Fluxgate | Low-end Faraday Sensor | Present Invention |
|---|---|---|---|---|
| Min. Det. Field, T. (@ 1 kHz, $\Delta f$=1Hz) | $10^{-6}$ | $10^{-10}$ | $10^{-8}$ | $10^{-12}$ |
| Max. Field, T | | $10^{-4}$ | $10^{-1}$ | $10^{-4}$ |
| Frequency Response | DC - 10 kHz | DC - 2 kHz | DC - 100 MHz | DC - 10 MHz |
| Temperature Sensitivity | High | Average | Average* | Average* |
| Typical Head Size (mm) | 5 x 5 x 1 | 10 x 10 x 20 | 10 x 10 x 20* | 15 x 15 x 60 |
| EMI Immunity | No | No | Yes | Yes |
| Passive Operation | No | No | Yes | Yes |

T=Tesla
*Projected Figures

FIG. 6

FARADAY EFFECT CONTINUOUS CIRCUIT FLUX CONCENTRATING MAGNETIC FIELD SENSOR

FIELD OF THE INVENTION

The present invention relates to the use of a Faraday effect sensor in combination with a coaxial flux concentrator to create a magnetic field sensor capable of measuring uniform magnetic fields.

BACKGROUND OF THE INVENTION

The Faraday effect can be described as the polarization rotation ("Faraday Rotation") which occurs when linearly polarized light is transmitted through an optical material exposed to a magnetic field aligned parallel to the light's propagation direction. Materials which exhibit the Faraday effect are called magneto-optic materials. Since in many magneto-optic materials the amount of rotation is proportional to the strength of the magnetic field, the magnetic field strength can be determined by measuring the angle of polarization rotation. This concept is the basis of all Faraday effect sensors.

Magneto-optic materials which can be used in Faraday effect sensors can either be diamagnetic, paramagnetic, or ferrimagnetic. Diamagnetic materials have very low magnetic permeability and also low magneto-optic sensitivity (i.e. polarization rotation per unit magnetic field strength). Paramagnetic materials also have low permeability, but are more sensitive than diamagnetic materials. Finally, ferrimagnetic materials, such as the iron garnets, exhibit very high permeability and higher magneto-optic sensitivity than either diamagnetic or paramagnetic materials.

The basis for the present invention is the increased sensitivity which results when a high-permeability magneto-optic material (such as yttrium iron garnet, or YIG) is combined with one or more high-permeability flux concentrators as illustrated in FIG. 2. Unlike previous Faraday effect sensors which have combined magneto-optic materials with flux concentrators, the present invention is intended and designed for the general measurement of uniform magnetic fields.

The idea of combining a conventional magnetic field sensor with a magnetic flux concentrator (i.e. a high-permeability device designed to concentrate magnetic fields) has previously been used to create sensors specifically designed for measuring electric current. High-permeability magneto-optic materials, Hall Probes, and magnetoresistive devices have all been used as the sensing element in these electric current sensors. Typically, a current-carrying conductor passes through a gapped toroidal-shaped flux concentrator. The magnetic field generated by the current in the conductor is concentrated across the gap in the toroid. The sensing element, located in the gap, typically produces an electrical signal proportional to the magnetic field in the gap. Since the magnetic field in the gap is proportional to the current in the conductor, the signal generated by the sensor is a measure of the electric current.

Below follows a summary of the prior art including reference to the state of the art improvements to sensors based on high-permeability magneto-optic materials. Only U.S. Pat. No. 4,692,703 (1987) to Extance, et al. teaches the use of linear overlapping flux concentrators surrounding a magnetic field sensor. Extance uses a Hall effect sensor as the magnetic field sensing element. His invention could be expected to yield increased sensitivity for measuring uniform magnetic fields including those of the earth. However, the effect of the flux concentrators in his sensor is not optimized because the Hall sensor, located in the overlapping region of the flux concentrators, has low permeability (since it is diamagnetic) and, therefore, breaks the magnetic continuity of the two flux concentrators.

The present invention uses a high-permeability magneto-optic material having a small diameter relative to a surrounding pair of high-permeability flux concentrators. Thus, the magneto-optic material and flux concentrators form a continuous magnetic circuit which results in much more efficient flux concentration than sensors which combine flux concentrators with low-permeability sensors (such as Hall probes). In the preferred embodiment, the cylindrical flux concentrators are tapered towards the high-permeability magneto-optic material to minimize flux leakage (and maximize flux concentration). Finally, the flux concentrators have a hole along their axis to allow the linearly-polarized beam of light to pass directly through both the flux concentrators and the (transmissive) high-permeability magneto-optic material. The diameter of the high-permeability magneto-optic material approximately equals the hole diameter of the flux concentrators, allowing the two ends of the magneto-optic cylinder to be partially inserted into the respective flux concentrator holes.

When a sample of yttrium iron garnet is used as the magneto-optic sensing element, the result is an increase in sensitivity of two hundred times compared to the sensitivity of the yytrium iron garnet alone.

SUMMARY OF THE PRIOR ART

"Fast, Sensitive Magnetic-Field Sensors Based on the Faraday Effect in YIG" by M. N. Deeter, A. H. Rose and G. W. Day, Journal of Lightwave Technology, Vol. 8, No. 12, December 1990.

YIG samples were used with a laser beam diameter approximately equal to the crystal diameter. Tests confirmed that YIG crystals could produce linear relationships between Faraday rotation angle of polarization and magnetic flux parallel to the crystal. The minimum detectable field is of the order of 10 nT to 100 nT over the frequency range of DC-700 MHz. It is postulated that greater sensitivity can be achieved with different iron garnet compositions and/or different sensing element geometries.

"Faraday-Effect Magnetic Field Sensors Based On Substituted Iron Garnets" by M. N. Deeter, A. H. Rose, and G. W. Day, SPIE, Vol. 1367, Fiber Optic and Laser Sensors VIII (1990), p. 243.

Researchers proved that six times greater sensitivity to magnetic fields can be achieved with gallium-substituted yttrium iron garnet than for pure yttrium iron garnet. The measured minimum detectable field was 100 picoteslas per root-hertz of bandwidth.

"Sensitivity Limits to Ferrimagnetic Faraday Effect Magnetic Field Sensors" by M. N. Deeter, A. H. Rose, G. W. Day and S. Samuelson, J. Appl. Phys., 70 (10), 15 Nov. 1991, p. 6407.

Researchers experimented to find optimal length-to-diameter ratios for a variety of diamagnetically substituted iron garnets having cylindrical shapes.

U.S. Pat. No. 3,324,393 (1967) to Casey et al. discloses a Faraday element that is capable of rotating the beam of plane polarized light by an angular amount substantially proportional to the magnetic field. Extra dense flint glass is used as the Faraday element. The element is placed in a gap in a toroidal core of high-permeability material which surrounds an electric conductor. The magnetic field in the toroid is concentrated across the gap and through the Faraday element. The angles of polarized light and light sensor are chosen to yield a linear relationship between the light intensity and the current flowing in the electric conductor.

U.S. Pat. No. 4,947,035 (1990) to Zook et al. discloses a Faraday effect sensor placed in proximity to a rotating permanent magnet. The rate of rotation of the magnet is computed by analyzing the output signal of the Faraday effect sensor. A cylindrical piece of YIG is used as the Faraday rotator material.

U.S. Pat. No. 3,980,949 (1976) to Feldtkeller discloses a two part Faraday rotator located in a gap of a magnetic toroid to sense very high currents as well as nominal currents. The first part of the Faraday rotator is comprised of a magnetically saturable part (YIG). The second part of the Faraday rotator is comprised of a diamagnetic or paramagnetic material (gadolinium-gallium-garnet piate). Lower currents produce Faraday rotation through part one while high currents produce Faraday rotation through part two.

U.S. Pat. No. 3,590,374 (1971) to Evans et al. discloses a magnetic core surrounding a conductor to be monitored. A plurality of energizing coils are coupled to the conductor via a secondary coil wound on the core. The plurality of energizing coils each have a YIG type Faraday rotator in proximity thereto for summing the total rotation, and thereby computing the current in the conductor. An alternative embodiment uses ring shaped magnetic cores to amplify the magnetic flux generated by the plurality of energizing coils. The Faraday rotators are placed in small air gaps,in the ring shaped magnetic cores.

U.S. Pat. No. 4,973,899 (1990) to Jones et. al. teaches a method for measuring AC and DC components of the current in a target conductor, by splitting the output light beam of the Faraday sensor material into AC and DC components. A sensor consisting of multiple layers of thin film Faraday material, a ceramic ferrule, and a gradient index lens combination are used to collimate the beam entering and exiting the Faraday material. The beam passes along the axis of a cylindrically shaped ceramic ferrule and gradient index lens combination which sandwiches the Faraday material.

Jones also teaches a method for nulling the sensor using a coil around the Faraday material, which is powered by a circuit measuring the output light intensity of the Faraday material. This circuit is described in detail in the Doerfler U.S. Pat. No. 4,947,107 which follows. This coil in effect is in the feedback loop of the circuit, opposing any decrease in the output light sensitivity, by generating a magnetic field in the Faraday sensor material, which is equal and opposite to the field being monitored.

U.S. Pat. No. 4,947,107 (1990) to Doerfler et al. discloses a duplicate of a portion of 4,973,899 which has the same assignee and co-inventor. The feedback circuit to magnetically null the rotation is disclosed.

U.S. Pat. No. 5,008,611 (1991) to Ulmer, Jr. discloses a method for minimizing the effect of stress birefringence in a Faraday effect optical medium by determining the existence of at least one non-birefringent angle of polarization.

U.S. Pat. No. 4,560,932 (1985) to Mitsui et al. discloses the intensification of the magnetic field by minimizing the distance between the opposing ends of the magnetized iron core. At the same time the laser beam is caused to travel within the Faraday material many times so as to increase the distance over which the magnetic field acts on the laser beam. The distance between the opposing ends of the magnetized iron core is minimized by beveling both the entrance and exit ends of the Faraday material.

U.S. Pat. No. 4,755,665 (1988) to Ulmer, Jr. et al. discloses two photodetectors each receiving a different component of polarized light from a laser beam passing through a Faraday rotator. Each detector has a computer capable of determining the component of AC to DC signal. A computer further determines a quotient by dividing a function of the first ratio by a function of the second ratio.

U.S. Pat. No. 5,149,962 (1992) to Maurice discloses a ring magnet to attract metal debris in oil. The collection of debris reduces the field strength of the ring magnet. A Faraday effect rotator is positioned adjacent the ring magnet to detect the field change and compute the amount of debris. The Faraday sensor is placed near a node of the ring magnet (aligned with its cylindrical core) so as to operate within the linear region of flux change as the debris accumulates on the outer perimeter of the ring magnet.

U.S. Pat. No. 4,745,357 (1988) to Miller discloses an improved fiber optic cable to Faraday rotator connection having a focusing parabolic collimating lens.

U.S. Pat. No. 5,075,546 (1991) to Kamada et al. discloses a Faraday rotator using a Bi substituted rare earth iron garnet crystal with a high sensitivity constant that is stable with temperature changes and the use of forming a Faraday rotator using a liquid phase epitaxy.

U.S. Pat No. 4,770,504 (1988) to Hansen et al. discloses a light switching element using a growth induced uniaxial anisotropy without changing the Faraday rotation. The iron garnet crystal is grown from a melt having lead oxide and boron oxide as a flux.

U.S. Pat. No. 5,041,761 (1991) to Wright et al. discloses a Faraday effect auto lamp current sensor. The known magnetic flux concentrating effect of creating a gap in a magnetized coil is used.

U.S. Pat. No. 4,791,361 (1988) to Beihoff et al. discloses a magnetic flux concentrator having a pair of magnetic poles, a gap therebetween of about 0.016 inch and a magnetic shunt.

U.S. Pat. No. 3,902,252 (1975) to Farber discloses a Hall Effect crystal (a semiconductor which when exposed to magnetic flux changes its potential difference) mounted .01 inches from a rotating funnel shaped flux concentrator and a fixed plate/funnel shaped flux concentrator. The result is an improved magnetic compass.

U.S. Pat. No. 4,692,703 (1987) to Extance et al. discloses a Hall Effect sensor having overlapping flux concentrators. Two flux concentrators have large diameters relative to a Hall Effect sensor sandwiched between them. The flux concentrators are alternatively driven into positive and negative magnetic saturation by the magnetic field created by current running through a coil placed around the flux concentrators. The DC magnetic field is sensed by detecting a second harmonic component in the output voltage of the Hall effect element. The structure of the flux concentrators of this sensor permits the measurement of uniform magnetic fields and is the closest art known to the present invention.

In summary what is known in the prior art is a large ratio of magnetic concentrator to magneto-optic material diameters in toroidal current sensing devices, close proximity of a magneto-optic sensor to a toroidal flux concentrator, and a high permeability of both a concentrator and the magneto-optic material used for current sensing configurations. The present invention improves the prior art by creating a continuous magnetic circuit between the sensing element and the coaxial flux concentrator(s) by means of contacting the ends of the high-permeability magneto-optic material with the ends of the high-permeability coaxial flux concentrator(s). Also new is passing the sensing optical beam straight through the flux concentrator into the magneto-optic material, thus allowing optical access to the magneto-optic element without interrupting the magnetic circuit. These improvements result in an increase in sensitivity of two hundred times compared to the sensitivity of the magneto-optic material alone.

SUMMARY OF THE INVENTION

The main object of the present invention is to provide a highly sensitive magnetic field sensor having an efficient magnetic circuit between a high-permeability Faraday sensor and a flux concentrator.

Another object of the present invention is to provide the flux concentrator with a large diameter and a tapered end adjacent the Faraday sensor to maximize the magnetic flux passing through the Faraday sensor.

Another object of the present invention is to provide a pair of flux concentrators each having a hole along the long axis wherein the pair of flux concentrators are in coaxial alignment with the Faraday sensor, and the Faraday sensor is either partially inserted into the hole or else, if the Faraday sensor has a diameter greater than the hole diameter, is in contact with the tapered ends of the flux concentrators. In this arrangement excellent magnetic coupling between the flux concentrators and the magneto-optic sensing element is achieved without blocking the optical path required for the sensing beam of light.

Other objects of this invention will appear from the following description and appended claims, reference being made to the accompanying drawings forming a part of this specification wherein like reference characters designate corresponding parts in the several views.

An optical source, collimator and polarizer are used to transmit a plane-polarized beam through one end of a cylindrical flux concentrator. The cylindrical flux concentrator has a hole along its longitudinal axis. The beam passes through the hole and enters a Faraday sensor which is mounted in contact with the flux concentrator. Because the Faraday sensor and the flux concentrator elements both have high magnetic permeability, they act magnetically as a single component.

The flux concentrator enhances the sensitivity of the Faraday sensor by:

1) reducing the demagnetizing factor of the Faraday sensor, and
2) constricting the measured flux into the Faraday sensor by having a large ratio of flux concentrator diameter to Faraday sensor diameter.

Both these effects increase the magnetic flux density within the magneto-optic material which effectively reduces the magneto-optic material's saturation field. As long as both the flux concentrator and magneto-optic material are composed of high-permeability material, and are either in contact or in close proximity, the effective demagnetizing factor of their system is determined by their overall dimensions. In summary, the first effect of the flux concentrator in the present invention is simply to modify the effective demagnetizing factor of the magneto-optic material. If the demagnetizing factor of the system defined by the flux concentrator and the magneto-optic material is smaller than that of the magneto-optic material alone, then the saturation field will be reduced, and the sensitivity will be enhanced.

The second effect of the present invention's flux concentrator can be called flux constriction. If both flux concentrator elements and the magneto-optic material had identical uniform cross sections, then the magnetic flux density would be approximately uniform throughout the concentrator and the magneto-optic material. But the present invention uses a relatively large ratio of cross sectional area of the flux concentrator to the magneto-optic material and a straight linear alignment of the components. The result is a correspondingly higher flux density in the magneto-optic material proportional to the cross sectional area ratio noted above. Finally flux leakage is minimized by using flux concentrator elements having tapered ends.

The preferred embodiment uses an identical pair of tapered flux concentrators each having a diameter at least ten times the diameter of the magneto-optic sensor. The combination of the two effects noted above results in an increase in sensitivity of two hundred times.

BRIEF DESCRIPTION OF THE DRAWINGS

FIG. 6 is a table of the present invention characteristics versus the prior art.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE PREFERRED EMBODIMENT

Figure 1:
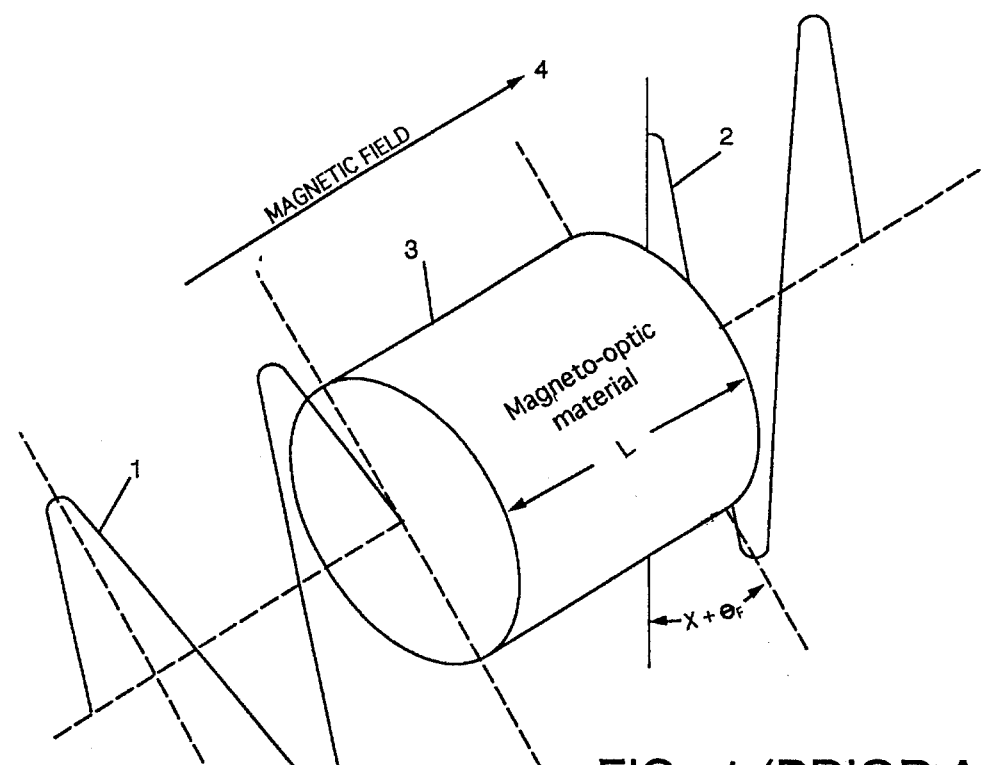
FIG. 1 is an illustration of the Faraday effect phenomenon known in the prior art.

Referring first to FIG. 1, a linearly-polarized light wave 1 is initially polarized at angle X. The wave passes through a high-permeability magneto-optic material 3. A magnetic field 4 is applied to the magneto-optic material in a direction parallel to the propagation direction of the light wave. As the wave exits the magneto-optic material, the light wave is polarized at angle $X+\theta_F$, where $\theta_F$ is the Faraday rotation angle caused by the applied magnetic field. For ferrimagnetic magneto-optic materials (including the iron garnets), $\theta_F$ is given by the product of the saturation Faraday rotation $\theta_F^{sat}$ and the normalized magnetization $M/M_{sat}$, where M is the component of magnetization parallel to the light wave's propagation direction, and $M_{sat}$ is the material's saturation magnetization. Both $\theta_F$ and $\psi_f^{sat}$ are proportional to L, the length of the magneto-optic material.

The theory of operation of the Faraday effect is based on the two circularly polarized components (not shown) of the linearly-polarized light wave 1. These two components travel at slightly different velocities such that a phase mismatch develops as the two waves propagate in the magneto-optic material 3. As a result, the reconstructed linearly polarized light wave 2 exiting the magneto-optic material 3 is rotated by the angle $\theta_F$.

Figure 2:
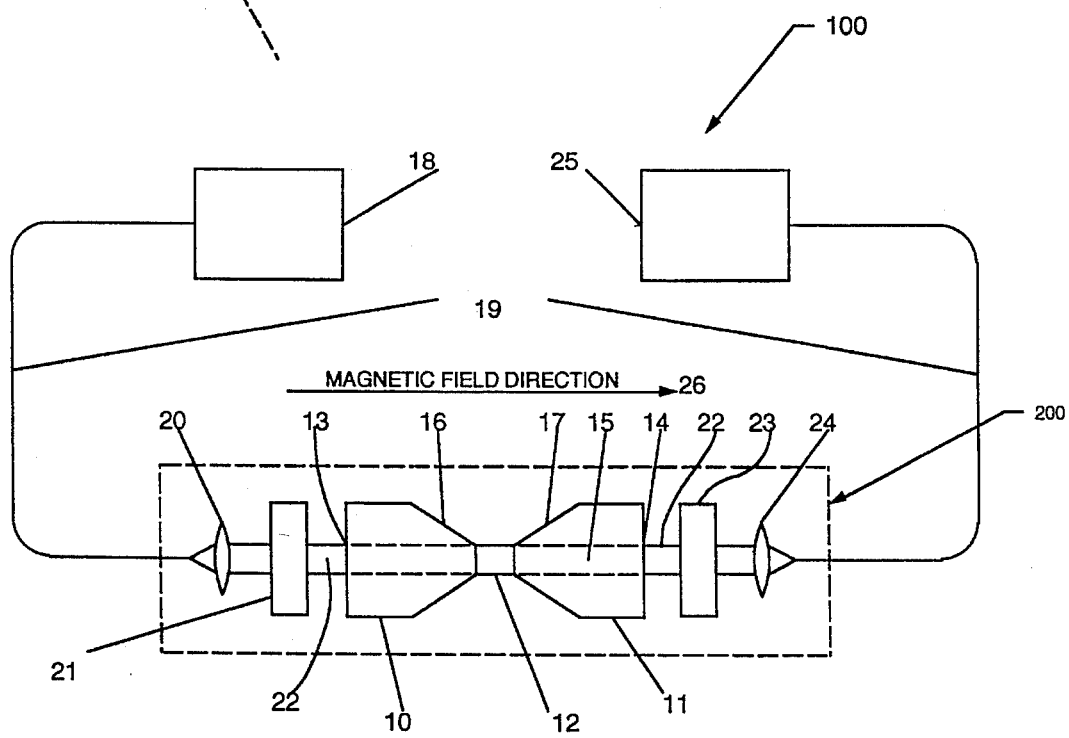
FIG. 2 is a schematic of the present invention having a pair of flux concentrators.

Referring next to FIG. 2, a pair of identical flux concentrators 10 and 11 are placed in contact with the high-permeability magneto-optic material 12. Along the axes of flux concentrators 10 and 11 are holes 13 and 14 allowing optical access to the magneto-optic material 12. The tapered ends 16 and 17 of the flux concentrators 10 and 11 efficiently concentrate the magnetic field into the magneto-optic material 12.

In operation, the light source 18 (preferably a diodepumped Nd:YAG laser with a wavelength of 1.32 μm) emits light which is sent to the sensing head (indicated by the dashed box 200) through the optical fiber 19. A lens 20 collimates the light emitted by the end of the optical fiber 19 into a parallels (non-divergent) beam of light. A linear polarizer 21 only transmits light 22 polarized parallel to the transmission axis of the polarizer. The linearly-polarized beam of light travels through the flux concentrator hole 13, the high-permeability magneto-optic material 12, the flux concentrator hole 14, and the linear polarizer 23. The transmission axis of the linear polarizer 23 is oriented at 45° with respect to the transmission axis of the linear polarizer 21. The function of polarizer 23 is to convert magnetic-field-induced changes in the polarization rotation angle into changes in optical intensity which can then be measured by an optical detector. The lens 24 focuses the beam of light into the return optical fiber 19 which sends the light to the optical detector and signal processing electronics 25.

The theory of operation follows below.

The magneto-optic material 12 and the flux concentrators 10 and 11 all have high magnetic permeability so that they act magnetically as a single component. The flux concentrators 10 and 11 can be made of either a nickel-zinc ferrite or a magnesium-zinc ferrite composition. The sensitivity S of ferrimagnetic (high-permeability) magneto-optic sensors is approximately given by the ratio of the saturation Faraday rotation $\theta_F^{sat}$, to the saturation field $H_{sat}$ which is defined as the magnetic field required to saturate the magneto-optic material's magnetization. For high-permeability bulk magneto-optic sensors without added flux concentrators, $H_{sat}$ is approximately given by the product of the material's saturation magnetization $M_{sat}$, and its demagnetization factor $N_D$, which depends only on the shape of the material. Mathematically, $$S \approx \frac{\theta_F^{sat}}{H_{sat}} \approx \frac{\theta_F^{sat}}{N_D M_{sat}} .$$

Numerically, $N_D$ varies between values of zero (in the case of a long thin rod magnetized alone the rod's axis) and one (in the case of a thin plate magnetized perpendicular to the plate's surfaces).

The flux concentrator enhances the sensitivity of the magneto-optic material through two distinct effects. Both effects, however, increase the magnetic flux density within the magneto-optic material which effectively reduces the magneto-optic material's saturation field. As long as both the flux concentrator and magneto-optic material are composed of high-permeability material, and are either in contact or in close proximity (as shown in FIG. 2), the effective demagnetizing factor of their system is determined by their overall dimensions. Therefore, the first effect of the flux concentrator is simply to modify the effective demagnetizing factor of the magneto-optic material. If the demagnetizing factor of the system defined by the flux concentrator and the magneto-optic material is smaller than that of the magneto-optic material alone, the saturation field will be reduced and the sensitivity will be enhanced.

The second effect of the flux concentrator can be called flux constriction. If both flux concentrator elements and the magneto-optical material in FIG. 2 had identical uniform cross sections (as in a cylinder), then the magnetic flux density would also be approximately uniform throughout the concentrator and magneto-optic material. However, if the cross-sectional area of the magneto-optic material is less than that of the flux concentrator elements, as shown in FIG. 2, the flux density must be correspondingly higher in the magneto-optic material. The maximum sensitivity enhancement due to this effect can be calculated by assuming that the magnetic flux lines transfer from the concentrator elements into the magneto-optical material with no flux leakage. The problem of flux leakage is minimized by using tapered concentrator elements as shown in FIG. 2. With no flux leakage, the total magnetic flux $\Theta$ is $$\Theta = B_C A_C = B_{MO} A_{MO}$$

where $B_C$ and $A_C$ are the flux density and cross-sectional area in the concentrator elements, and $H_{MO}$ and $A_{MO}$ are the flux density and cross-sectional area in the magneto-optic element. Therefore, $$B_{MO} = B_C \frac{A_C}{A_{MO}} ,$$

which shows that the flux density within the magneto-optic material is greater than that in the concentrator elements by the ratio of their cross-sectional areas.

The total sensitivity enhancement produced by the flux concentrator is given by the product of the enhancement factor which represents the modified demagnetization factor and the enhancement factor which represents the effect of flux constriction.

Figure 3:
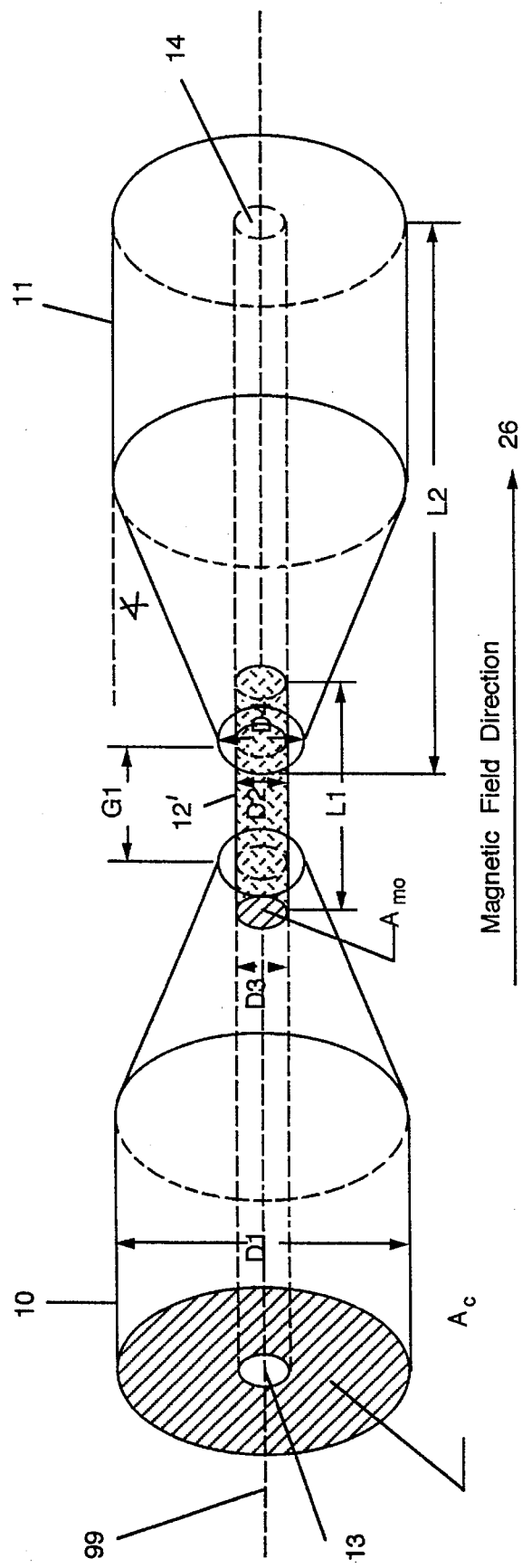
FIG. 3 is a front plan view of the dual flux concentrator preferred embodiment with a partial cutaway showing the laser beam.

FIG. 3 shows the preferred embodiment. Flux concentrator 10 further comprises cross-sectional area $A_C$ and magneto-optic material 12' further comprises cross-sectional area $A_{MO}$. Optical axis 99 is shown in axial alignment with flux concentrators 10, 11 and magneto-optic material 12'. The preferred dimensions are $D_1$=12.70 mm, $D_2$=1.0 , mm, $D_3$=1.00 mm, $L_1$=3.00 mm, $L_2$=25.4 mm. The taper angle κ is 19.3°. The flux concentrators are preferably made of nickel-zinc ferrite. The magneto-optic material is single crystal yttrium iron garnet ($Y_3Fe_5O_{12}$, abbreviated as YIG).

The best results are obtained when magneto-optic material 12' is inserted slightly into holes 13, 14, thereby resulting in gap $G_1$=1.2 mm. Approximately 0.9 mm of each end of the magneto-optic material 12' is inserted into holes 13, 14.

Figure 4:
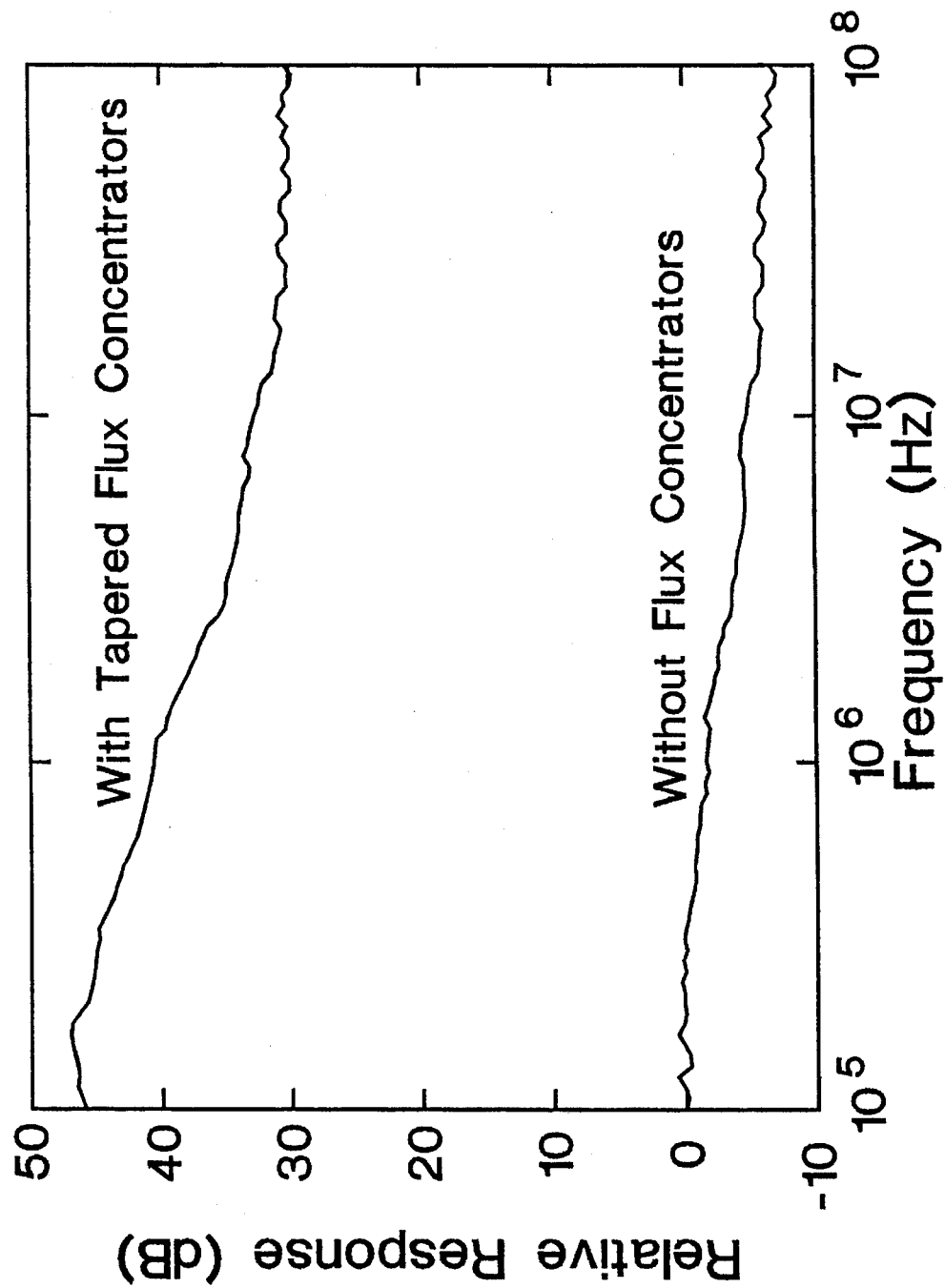
FIG. 4 is a graph of the relative frequency response of a crystal of yttrium iron garnet (YIG) with and without the present invention.

The relative frequency response of the embodiment shown in FIG. 3 was measured using a TEM cell (a device used to generate,uniform electric and magnetic fields) and compared to the response of the magneto-optic crystal 12' alone. For both sensors, the frequency was varied between 100 kHz and 100 MHz while the amplitude of the magnetic field 26 was held constant. The data are compared in FIG. 4. At 100 kHz, the embodiment shown in FIG. 3 demonstrated a signal increase of 46 dB (equivalent to a sensitivity increase of 200 times) relative to the signal produced by the magneto-optic material 12' alone.

Figure 5:
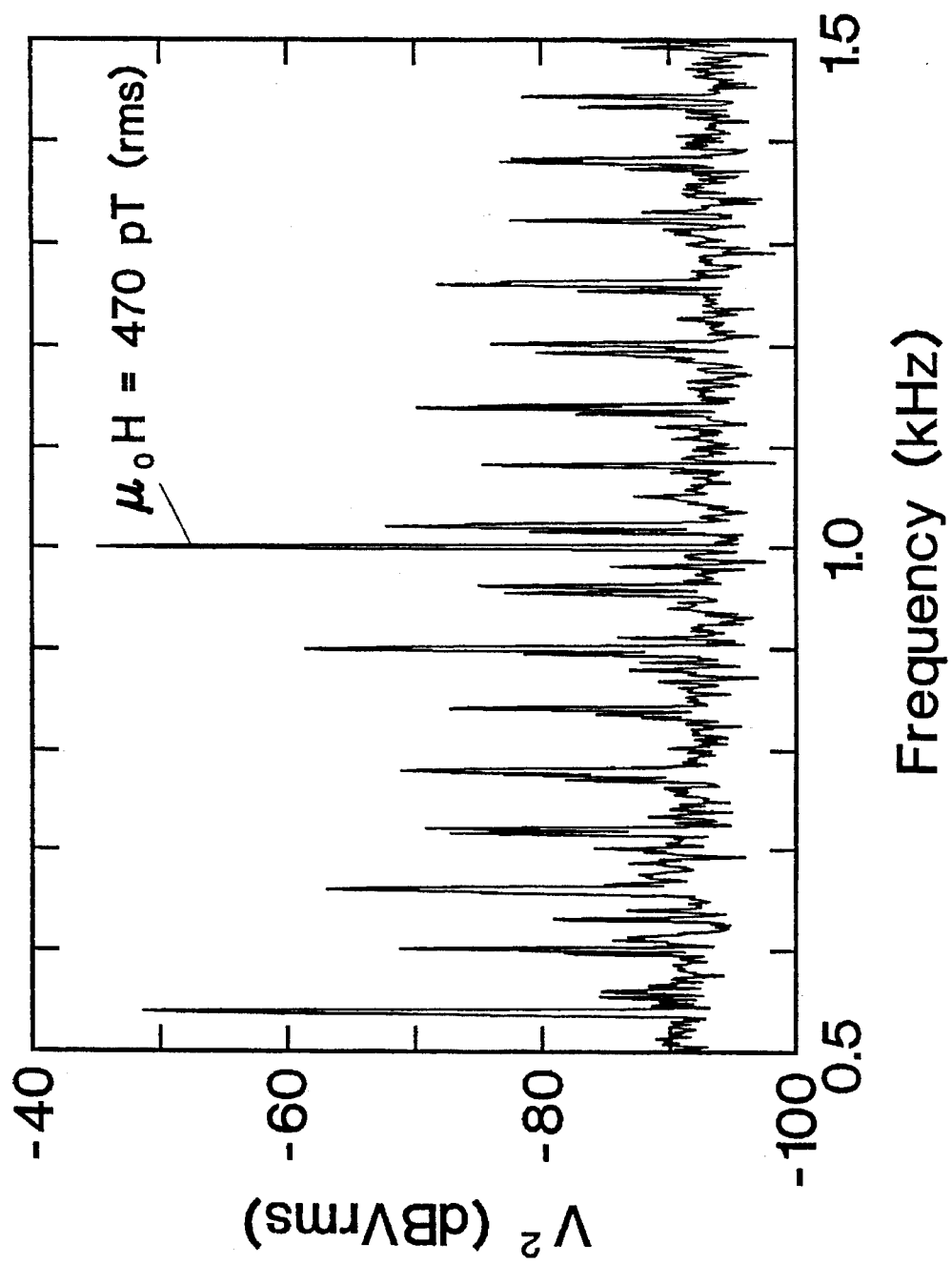
FIG. 5 is a graph of the signal and noise spectrum obtained with the present invention when subjected to a magnetic field amplitude of 470 pT at a frequency of 1 kHz.

The minimum detectable field of the present invention was measured with a setup like that shown in FIG. 2, but with the second polarizer 23 replaced with a polarizing beamsplitter. The two resulting beams leaving the polarizing beamsplitter were detected separately with two detectors connected to the inputs of a differential amplifier. The output of the differential amplifier was measured with an electrical spectrum analyzer. FIG. 5 shows the electrical signal and noise spectrum generated by the embodiment of FIG. 3 when a magnetic field of 470 pT (rms) was applied to the sensor at a frequency of 1 kHz. The signal to noise ratio (S/N) is approximately 48.4 dB. Using this value of S/N and the noise bandwidth of the spectrum analyzer of 1.87 Hz, the minimum detectable field at 1 Khz is determined to be 1.3 picotesla per root-hertz of bandwidth. FIG. 6 compares the performance characteristics of the present invention with the prior art.

Alternative embodiments (not shown) include only one flux concentrator, high permeability translucent flux concentrators and/or rectangular flux concentrators.

Figure 7:
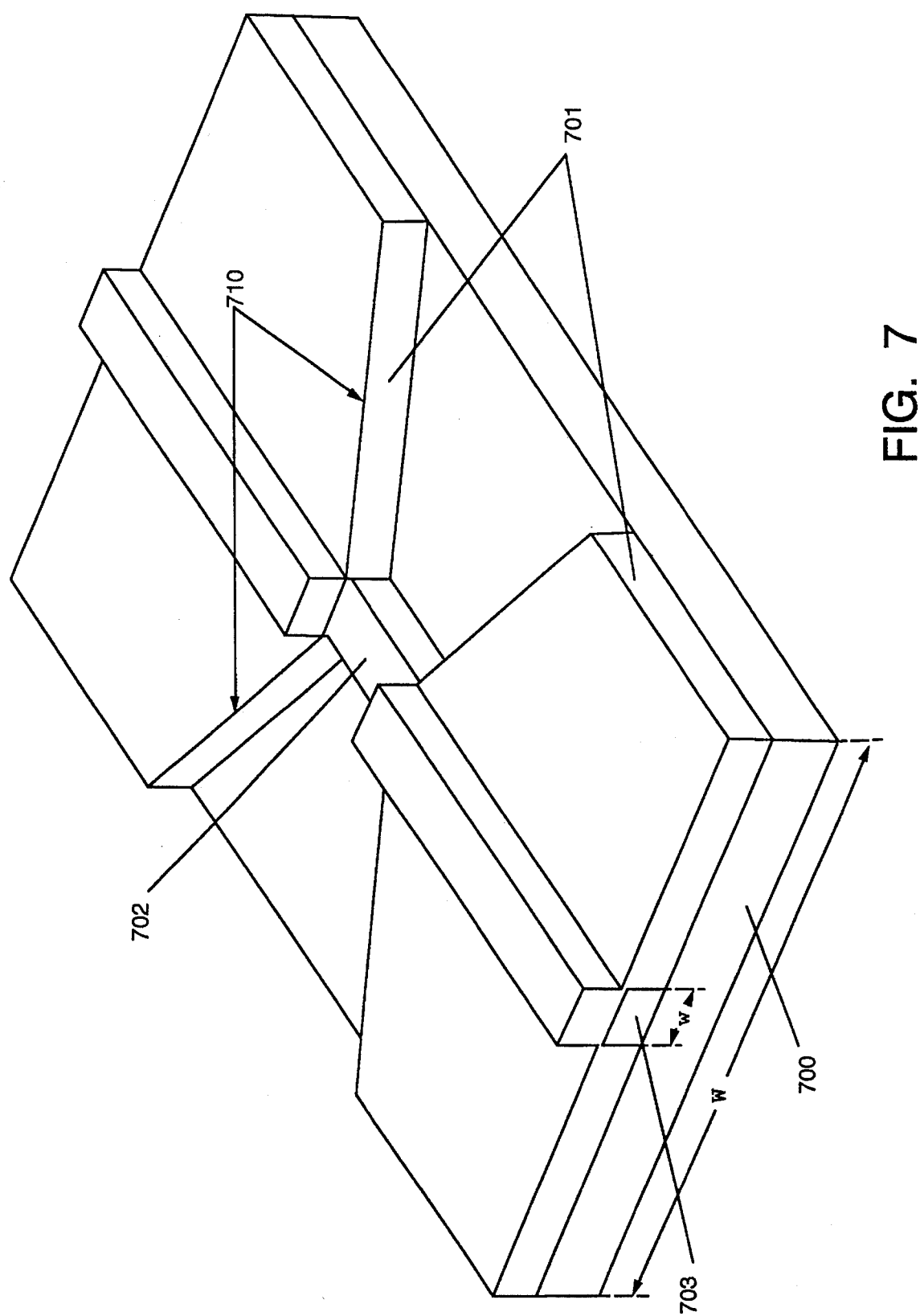
FIG. 7 is a drawing of an alternative embodiment of the magnetic field sensor employing thin-film growth technology.

Another embodiment would allow the entire device to be fabricated as a thin film structure, and would, therefore, be much more compact than the previous embodiment. Just as in the conventional structure, the thin-film version consists of a high-permeability magneto-optic material magnetically coupled to a magnetic flux concentrator. However, the fabrication of the device employs film-growth technology (such as liquid-phase epitaxy, sputtering, and/or evaporation) for both the magneto-optic sensor and the flux concentrator elements. An example of this embodiment is shown in FIG. 7. In this geometry, light propagates in channel waveguide 703 constructed on a suitable substrate 700. The flux concentrator layer 701 is deposited either below or above the optical waveguide 703 in such a way as to concentrate the magnetic flux through a segment 702 of the optical waveguide 703. (In FIG. 7 the flux concentration layer 701 is shown as if it had been evaporated on top of the magneto-optical channel waveguide 703). To achieve a large gain in sensitivity, the maximum width W of the flux concentrator layer 701 is much greater than the width w of the high-permeability optical waveguide 703. Tapering the width 710 of the flux concentrator layer 701 toward the exposed segment of the optical waveguide 702 is used to increase the magnetic coupling efficiency between the flux concentrator layer 701 and the exposed segment of the high-permeability magneto-optic waveguide 702.

This thin-film device has several advantages over the previous bulk-structure embodiment. Because the device is a thin-film device, batch processing could be used to fabricate many devices simultaneously, resulting in decreased fabrication costs. The magneto-optic waveguide could be fabricated using liquid-phase epitaxy which presently is capable of producing more sensitive magneto-optic materials than methods used to grow bulk magneto-optic materials. Provided the structure of the waveguide was properly designed, the device could be coupled to standard fiber optics using simple butt-coupling. This coupling technique is considerably simpler and cheaper than coupling techniques which require lenses. Finally, the entire device would be much more compact than the previously proposed embodiment, without any necessary loss in sensitivity. This device exploits exactly the same principles as the original embodiment.

Although the present invention has been described with reference to preferred embodiments, numerous modifications and variations can be made and still the result will come within the scope of the invention. No limitation with respect to the specific embodiments disclosed herein is intended or should be inferred.

We claim:

1. A magneto-optic magnetic field sensor comprising:

a high-permeability magnetic flux concentrator;

a high-permeability magneto-optic material located in physical contact with said magnetic concentrator and providing a continuous path of high-permeability between the magneto-optic material and the magnetic flux concentrator;

said magnetic concentrator further comprising a cross-sectional area substantially greater than the cross-sectional area of said magneto-optic material;

an optical detector;

a sensing beam of light; and said magnetic flux concentrator further including a channel therethrough allowing the sensing beam of light to transmit through the channel and simultaneously through the magneto-optic material, and then to the optical detector.

2. The magnetic field sensor of claim 1 wherein said magnetic flux concentrator further comprises a pair of cylindrical members located co-axially one on each end of said magneto-optic material and co-axial to the longitudinal axis of the magneto-optic material.

3. The magnetic field sensor of claim 2 wherein said pair of cylindrical members further comprise a tapered end adjacent said magneto-optic material.

4. The magnetic field sensor of claim 2 wherein said pair of cylindrical members is selected from the group consisting of nickel-zinc ferrite and magnesium-zinc ferrite compositions.

5. The magnetic field sensor of claim 2 wherein said magneto-optic material further comprises a cylindrical shape with the ends of the cylinder partially inserted into said respective channels in said pair of cylindrical members, thereby leaving a gap between said pair of cylindrical members.

6. The magnetic field sensor of claim 1 wherein said magneto-optic material further comprises a ferromagnetic iron garnet crystal.

7. The magnetic field sensor of claim 1 wherein said optical sensing beam further comprises a plane polarized beam formed by the use of a laser beam in conjunction with a collimating lens and a polarizer.

8. A magneto-optic magnetic field sensor comprising:

a high permeability magneto-optic sensor having a longitudinal axis;

a pair of cylindrical high-permeability magnetic flux concentrators aligned on each end of said magneto-optic sensor and in co-axial alignment with said magneto-optic sensor;

said pair of flux concentrators each further comprising a hole along its longitudinal axis and a cross-sectional area substantially greater than said magneto-optic sensor;

said magneto-optic sensor further comprising partial insertion into each of said flux concentrator holes leaving a gap between said flux concentrators;

a linearly-polarized sensing beam passing through one of said flux concentrator holes then said magneto-optic sensor then the other of said flux concentrator holes; and a detector sensing changes in the sensing beam intensity caused by changes in the Faraday rotation of the sensing beam as the sensing beam passes through the magneto-optic sensor and a polarizer.

* * * * *